(12) United States Patent
Urakawa (10) Patent No.: US 11,258,403 B2
(45) Date of Patent: Feb. 22, 2022

(54) VOLTAGE CONTROLLED OSCILLATOR, SEMICONDUCTOR INTEGRATED CIRCUIT, AND TRANSMISSION AND RECEPTION DEVICE

(71) Applicant: KIOXIA CORPORATION, Tokyo (JP)

(72) Inventor: Go Urakawa, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/002,123

(22) Filed: Aug. 25, 2020

(65) Prior Publication Data

US 2021/0083624 A1 Mar. 18, 2021

(30) Foreign Application Priority Data

Sep. 12, 2019 (JP) .............................. JP2019-165828

(51) Int. Cl.
*H04L 27/12* (2006.01)
*H03B 5/12* (2006.01)
(Continued)

(52) U.S. Cl.
CPC ......... *H03B 5/1212* (2013.01); *H03B 5/1228* (2013.01); *H04B 1/04* (2013.01);
(Continued)

(58) Field of Classification Search
CPC ............. H04L 27/0008; H04L 27/2017; H04L 27/2272; H04L 7/0331; H03B 5/1243;
(Continued)

(56) References Cited

U.S. PATENT DOCUMENTS 8,076,982 B2    12/2011  Suzuki
2005/0197085 A1*  9/2005  Tsukizawa ........... H03B 5/1215
                                                       455/264
(Continued)

FOREIGN PATENT DOCUMENTS

JP         2011-244086 A    12/2011

OTHER PUBLICATIONS

Wang, Fei et al., "A Noise Circulating Oscillator," IEEE Journal of Solid-State Circuits, Mar. 2019, vol. 54, No. 3, pp. 696-708.

*Primary Examiner* — Khai Tran
(74) *Attorney, Agent, or Firm* — Foley & Lardner LLP (57) ABSTRACT

A voltage controlled oscillator includes a first inductor; a first variable capacitance unit including a first variable capacitance element having a variable capacitance and a second variable capacitance element having a variable capacitance; a first node configured for application of a first voltage to the first variable capacitance unit; a cross-coupled unit including a first transistor and a second transistor, an output of the first transistor connected to an input of the second transistor; a current source configured to flow a current through the first inductor, the first transistor, and the second transistor; a second variable capacitance unit including a third variable capacitance element having a variable capacitance, and a fourth variable capacitance element having a variable capacitance; and a second node different from the first node configured for application of a second voltage to the second variable capacitance unit.

18 Claims, 10 Drawing Sheets

(51) Int. Cl.
*H04L 7/033* (2006.01)
*H04B 1/16* (2006.01)
*H04L 27/20* (2006.01)
*H04L 27/227* (2006.01)
*H04B 1/04* (2006.01)

(52) U.S. Cl.
CPC ............ *H04B 1/16* (2013.01); *H04L 7/0331* (2013.01); *H04L 27/20* (2013.01); *H04L 27/2272* (2013.01); *H03B 2200/004* (2013.01); *H03B 2200/0088* (2013.01)

(58) Field of Classification Search
CPC ............ H03B 5/1852; H03B 2200/004; H03B 5/1284; H03K 17/6872; H03K 19/00361; H03L 2207/06; H03L 7/0802
USPC ........... 375/302, 376; 331/57, 115, 156, 167
See application file for complete search history.

(56) References Cited

U.S. PATENT DOCUMENTS

| | | | |
|---|---|---|---|
| 2008/0303603 A1 | 12/2008 | Kousai et al. | |
| 2009/0066431 A1* | 3/2009 | Shin ................ | H03B 5/1852 331/117 FE |
| 2010/0264994 A1* | 10/2010 | Duperray ............ | H03B 5/1243 331/117 FE |
| 2016/0285465 A1* | 9/2016 | Abe .................... | H03B 5/1278 |

* cited by examiner

VOLTAGE CONTROLLED OSCILLATOR, SEMICONDUCTOR INTEGRATED CIRCUIT, AND TRANSMISSION AND RECEPTION DEVICE

CROSS-REFERENCE TO RELATED APPLICATION(S)

This application is based upon and claims the benefit of priority from Japanese Patent Application No. 2019-165828, filed Sep. 12, 2019, the entire contents of which are incorporated herein by reference.

FIELD

Embodiments of the present disclosure relate to a voltage controlled oscillator, a semiconductor integrated circuit, and a transmission and reception device.

BACKGROUND

A voltage controlled oscillator includes a current source and a MOSFET typically having a parasitic capacitance. In such a voltage controlled oscillator, when a current of the current source fluctuates, an amplitude of the current changes and thus the parasitic capacitance of the MOSFET changes, so that an oscillation frequency thereof fluctuates. Therefore, a noise of the current source may be frequency-modulated, and a phase noise in a low frequency band may be deteriorated. The phase noise in a low frequency band is greatly affected by a flicker of the current source. Therefore, it is desired to increase an area of the current source in order to prevent the flicker.

DETAILED DESCRIPTION

Embodiments provide a voltage controlled oscillator, a semiconductor integrated circuit, and a transmission and reception device that are capable of reducing the phase noise in a low frequency band and reducing the area of the current source.

In general, according to one embodiment, a voltage controlled oscillator includes a first inductor; a first variable capacitance unit connected in parallel with the first inductor, the first variable capacitance unit including a first variable capacitance element having a variable capacitance and a second variable capacitance element having a variable capacitance; a first node configured for application of a first voltage to the first variable capacitance unit; a cross-coupled unit connected to the first inductor, the cross-coupled unit including a first transistor and a second transistor, wherein an output of the first transistor is connected to an input of the second transistor; a current source configured to flow a current through the first inductor, the first transistor, and the second transistor; a second variable capacitance unit including a third variable capacitance element that is connected to the first transistor and having a variable capacitance, and a fourth variable capacitance element that is connected to the second transistor and having a variable capacitance; and a second node different from the first node configured for application of a second voltage to the second variable capacitance unit.

Hereinafter, voltage controlled oscillators according to embodiments, a semiconductor integrated circuit including the voltage-controlled oscillators, and a transmission and reception device including the semiconductor integrated circuit including the voltage controlled oscillators will be described in detail with reference to the drawings.

The drawings referred to are schematic views. In the following description, elements having the same functions and configurations are denoted by the same reference numerals.

(Voltage Controlled Oscillator According to First Embodiment)

Figure 1:
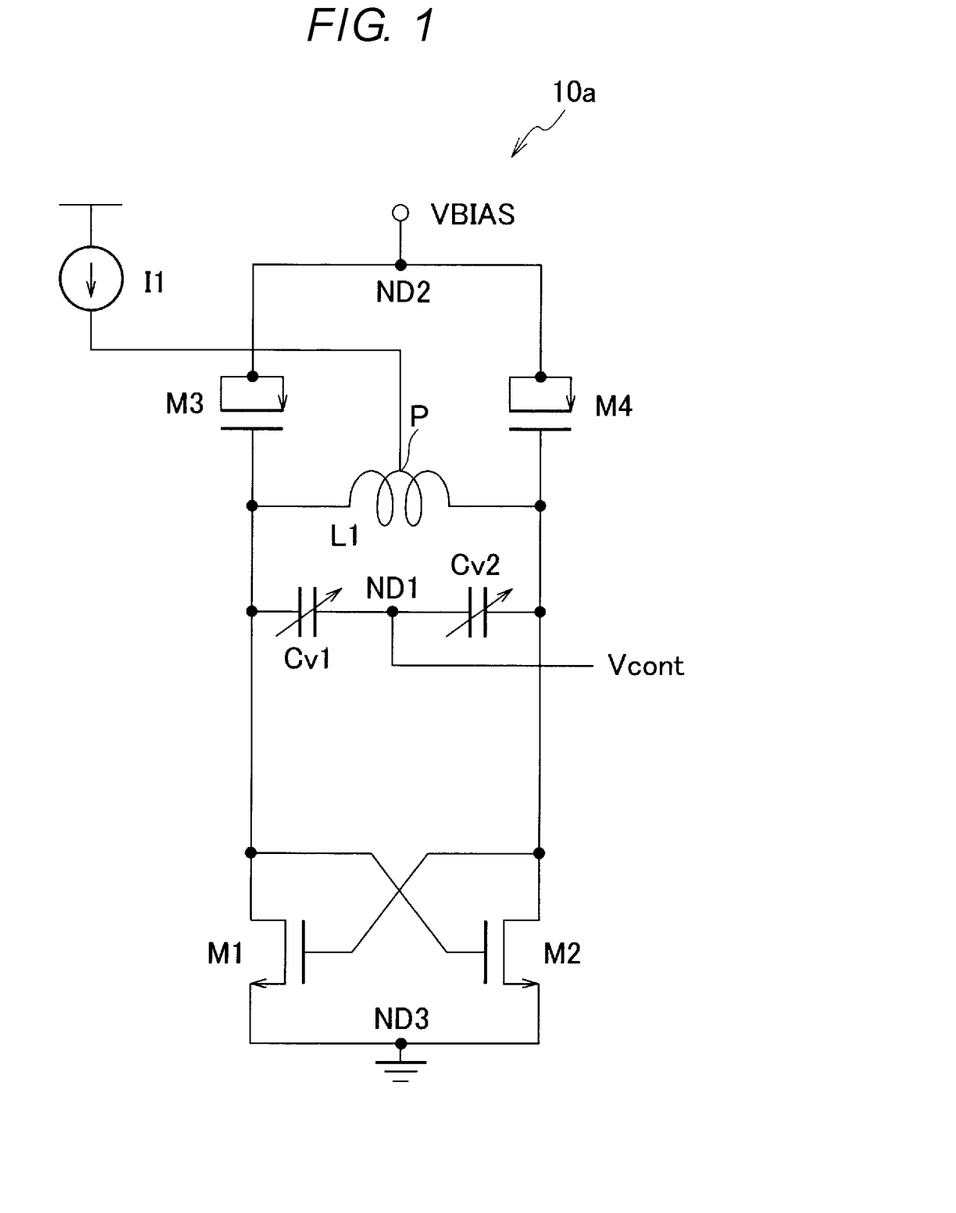
FIG. 1 is a configuration diagram of a voltage controlled oscillator according to a first embodiment.

FIG. 1 is a configuration diagram of a voltage controlled oscillator 10a according to a first embodiment. The voltage controlled oscillator 10a includes a current source I1, an inductor L1, N-type metal-oxide-semiconductor (MOS) transistors M1 and M2, P-type metal-oxide-semiconductor (PMOS) capacitors M3 and M4, and variable capacitance elements Cv1 and Cv2. The variable capacitance elements Cv1 and Cv2 are varactors and the like. The variable capacitance element Cv1 corresponds to a first variable capacitance element whose capacitance is variable according to a voltage applied to both ends, and the variable capacitance element Cv2 corresponds to a second variable capacitance element whose capacitance is variable according to a voltage applied to both ends. It is appreciated that the present disclosure is not limited to the configuration of the voltage controlled oscillator 10a of the first embodiment. Thus, a voltage controlled oscillator 10 may be used as a comprehensive notation, as an example.

The current source I1 is connected to a power supply (not shown) having a certain voltage and serving as a current supply source and a midpoint P of the inductor L1, and supplies a bias current to the N-type MOS transistors M1 and M2 via the midpoint P. One end (an example of a first end) of the variable capacitance element Cv1, a drain of the N-type MOS transistor M1, and one end (an example of a first end) of the PMOS capacitor M3 are connected to one end (an example of a first end) of the inductor L1. One end (an example of a first end) of the variable capacitance element Cv2, a drain of the N-type MOS transistor M2, and one end (an example of a first end) of the PMOS capacitor M4 are connected to the other end (an example of a second end) of the inductor L1.

The other end (an example of a second end) of the variable capacitance element Cv1 and the other end (an example of a second end) of the variable capacitance element Cv2 are commonly connected, and a first variable voltage Vcont is applied to the common connection end. By varying the first variable voltage Vcont, a capacitance value of the variable capacitance element Cv1 and a capacitance value of the variable capacitance element Cv2 are changed. The variable capacitance element Cv1 and the variable capacitance element Cv2 are connected in parallel with the inductor L1, and constitute a first variable capacitance unit to which the first variable voltage Vcont is applied via a first node ND1.

The N-type MOS transistor M1 includes a first main terminal, a second main terminal, and a first control terminal. The N-type MOS transistor M2 includes a third main terminal, a fourth main terminal, and a second control terminal. The drain (an example of the first main terminal) of the N-type MOS transistor M1 is connected to a gate (an example of the second control terminal) of the N-type MOS transistor M2, and a drain (an example of the third main terminal) of the N-type MOS transistor M2 is connected to a gate (an example of the first control terminal) of the N-type MOS transistor M1. A source (an example of the second main terminal) of the N-type MOS transistor M1 and a source (an example of the fourth main terminal) of the N-type MOS transistor M2 are connected to a node ND3 serving as a ground potential (reference potential). The N-type MOS transistor M1 and the N-type MOS transistor M2 constitute a cross-coupled unit.

One end of each of the PMOS capacitors M3 and M4 is a gate of a PMOS transistor, and the other end (an example of a second end) of each of the PMOS capacitors M3 and M4 connects a drain and a source of the PMOS transistor. Each of the PMOS capacitors M3 and M4 functions as a variable capacitance diode whose capacitance is variable according to a voltage applied to both ends, and is a varactor or the like.

A second variable voltage VBIAS is applied to the other ends (connection end) of the PMOS capacitors M3 and M4 via a second node ND2, and a voltage at one end of each of the PMOS capacitors M3 and M4 varies due to a change in a bias current from the second variable voltage VBIAS. Therefore, the PMOS capacitors M3 and M4 constitute a second variable capacitance unit whose capacitance changes due to a change in the voltage between both ends. The PMOS capacitor M3 is connected to the N-type MOS transistor M1 and corresponds to a third variable capacitance element whose capacitance is variable according to a voltage applied to both ends, and the PMOS capacitor M4 is connected to the N-type MOS transistor M2 and corresponds to a fourth variable capacitance element whose capacitance is variable according to a voltage applied to both ends.

The drain (output) of one transistor of the N-type MOS transistor M1 and the N-type MOS transistor M2 is connected to the gate (input) of the other transistor and an output signal is positively fed back, so that the voltage controlled oscillator 10a oscillates at a predetermined oscillation frequency. Both ends of the cross-coupled unit serve as output terminals of an oscillation signal (clock) having the predetermined oscillation frequency.

The oscillation frequency of the voltage controlled oscillator 10a is determined based on an inductance value of the inductor L1, a combined capacitance value of the capacitance value of the variable capacitance element Cv1 and the capacitance value of the variable capacitance element Cv2, a capacitance value of the PMOS capacitor M3, and a capacitance value of the PMOS capacitor M4. By external control, a value of the first variable voltage Vcont is changed, and the capacitance value of the variable capacitance element Cv1 and the capacitance value of the variable capacitance element Cv2 are changed, so that the oscillation frequency can be made variable.

(Operations and Effects)

Next, operation of the voltage controlled oscillator 10a will be described. First, the bias current from the current source I1 flows to the N-type MOS transistor M1 and the N-type MOS transistor M2 via the inductor L1.

Therefore, a potential of the drain of the N-type MOS transistor M1 and a potential of the drain of the N-type MOS transistor M2 rise. At this time, due to current fluctuation of the current source I1 caused by minute fluctuation of a power supply voltage or a temperature, an amplitude of the current flowing to the N-type MOS transistor M1 fluctuates, and due to the current amplitude fluctuation, a parasitic capacitance C1 between the drain and the source of the N-type MOS transistor M1 changes. For example, when the current fluctuation of the current source I1 increases, the parasitic capacitance C1 increases by a change capacitance $\Delta$C1.

Similarly, an amplitude of the current flowing to the N-type MOS transistor M2 fluctuates, and due to the current amplitude fluctuation, a parasitic capacitance C2 between the drain and the source of the N-type MOS transistor M2 changes. For example, when the current fluctuation of the current source I1 increases, the parasitic capacitance C2 increases by a change capacitance $\Delta$C2. Due to a capacitance change caused by the change capacitance $\Delta$C1 and the change capacitance $\Delta$C2, the oscillation frequency fluctuates and a phase noise in a low frequency band is deteriorated. Specifically, a noise included in the current source I1 is FM-modulated due to the frequency fluctuation, so that the phase noise in a low frequency band is deteriorated.

On the other hand, a voltage of the drain of the N-type MOS transistor M1 is applied to one end of the PMOS capacitor M3, and a voltage of the drain of the N-type MOS transistor M2 is applied to one end of the PMOS capacitor M4. Further, the second variable voltage VBIAS is applied to the other end of the PMOS capacitor M3 and the other end of the N-type MOS transistor M2.

At this time, since the voltage between the both ends of the PMOS capacitor M3 is reduced due to the voltage rise of the drain of the N-type MOS transistor M1, a depletion layer thereof decreases. Therefore, a capacitance C3 between the both ends of the PMOS capacitor M3 changes and decreases by a change capacitance $\Delta$C3. Further, since the voltage between the both ends of the PMOS capacitor M4 is reduced due to the voltage rise of the drain of the N-type MOS transistor M2, a depletion layer thereof decreases. Therefore, a capacitance C4 between the both ends of the PMOS capacitor M4 changes and decreases by a change capacitance $\Delta$C4.

At this time, the change capacitance $\Delta$C3 and the change capacitance $\Delta$C4 can be adjusted by adjusting the second variable voltage VBIAS by the external control. For example, by decreasing a value of the second variable voltage VBIAS, the change capacitance ΔC3 and the change capacitance ΔC4 can be increased to offset the increase in the change capacitance ΔC1 and the change capacitance ΔC2 and the capacitance change can be eliminated. That is, by correcting the parasitic capacitances of the N-type MOS transistors M1 and M2, which change due to the current fluctuation, with the capacitances of the PMOS capacitors M3 and M4, a change in a capacitance component of a tank circuit including the inductor L1 can be reduced.

According to the voltage controlled oscillator according to the first embodiment, by adding the PMOS capacitors M3 and M4 for correcting the change in the parasitic capacitance of the N-type MOS transistors M1 and M2, a parasitic capacitance change of the tank circuit does not occur even if the current from the current source changes. Therefore, the fluctuation of the oscillation frequency caused by the current fluctuation of the current source I1 can be mitigated. Accordingly, the phase noise in a low frequency band can be reduced. Further, since sensitivity to the current source noise can be mitigated by adding the PMOS capacitors M3 and M4, an area (size) of the current source I1 can be reduced. This is because the decreased area of the current source I1 is larger than an increased area of the added PMOS capacitors M3 and M4.

(Modification)

Figure 2:
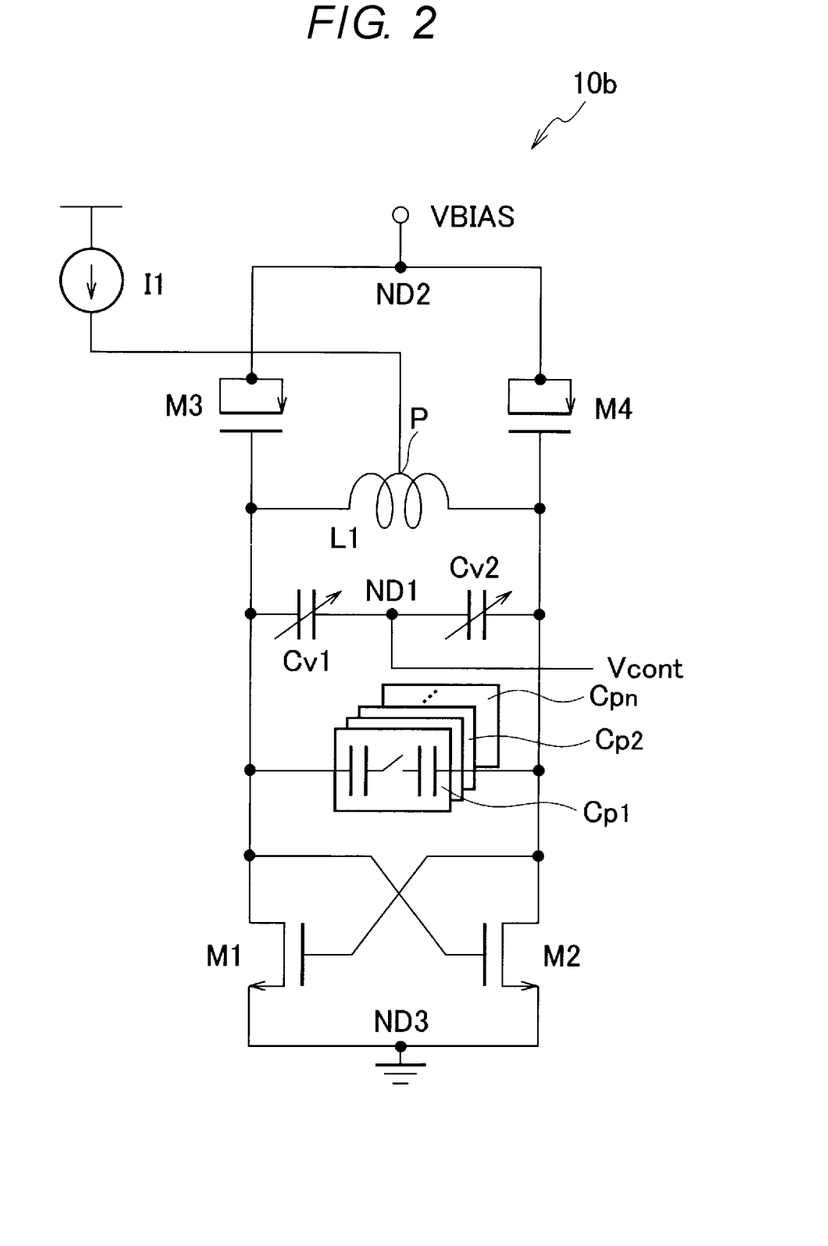
FIG. 2 is a configuration diagram of a voltage controlled oscillator according to a modification of the first embodiment.

FIG. 2 is a configuration diagram of a voltage controlled oscillator 10b according to a modification of the first embodiment. The voltage controlled oscillator 10b according to the modification of the first embodiment has a configuration in which a plurality of capacitance elements Cp1, Cp2, . . . , Cpn having fixed capacitance values are further connected between both ends of the inductor L1 (that is, in parallel with the inductor L1) in the configuration of the voltage controlled oscillator 10a according to the first embodiment.

An oscillation frequency of the voltage controlled oscillator 10b is basically determined based on the inductance value of the inductor L1, the combined capacitance value of the capacitance value of the variable capacitance element Cv1 and the capacitance value of the variable capacitance element Cv2, the capacitance value of the PMOS capacitor M3, and the capacitance value of the PMOS capacitor M4. However, the oscillation frequency may not be set to an appropriate value only with these values. In this case, by connecting the plurality of capacitance elements Cp1, Cp2, . . . , Cpn having fixed capacitance values between both ends of the inductor L1, the oscillation frequency of the voltage controlled oscillator 10b can be set to an appropriate value. By adding the capacitance element Cp in a stepwise manner, the frequency can be discretely and roughly adjusted, and then finely adjusted using a control voltage of a varactor.

(Voltage Controlled Oscillator According to Second Embodiment)

Figure 3:
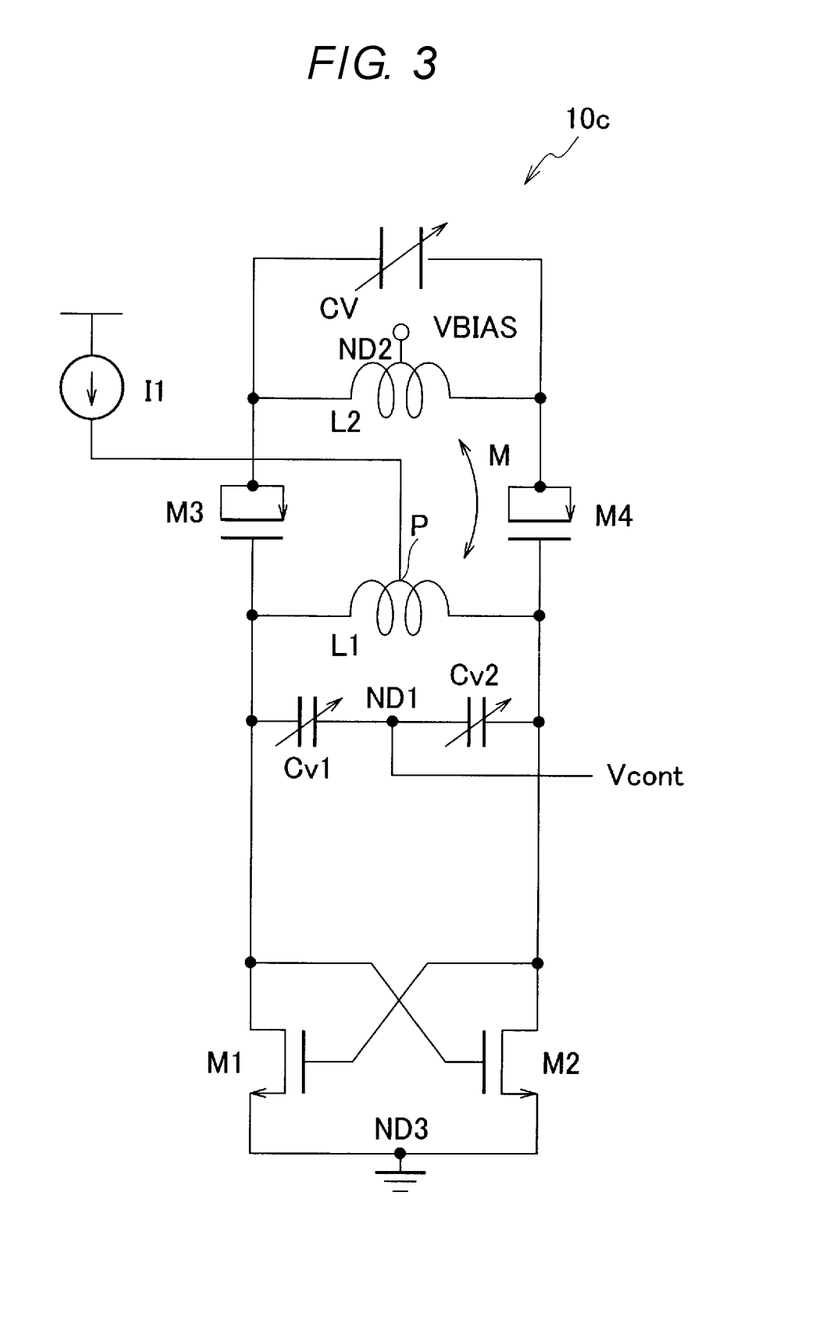
FIG. 3 is a configuration diagram of a voltage controlled oscillator according to a second embodiment.

FIG. 3 is a configuration diagram of a voltage controlled oscillator 10c according to a second embodiment. With respect to the voltage controlled oscillator 10a according to the first embodiment shown in FIG. 1, the voltage controlled oscillator 10c according to the second embodiment is further provided with a resonance circuit including a parallel circuit of an inductor L2 and a variable capacitance element Cv whose capacitance changes according to a voltage change. The variable capacitance element Cv corresponds to a fifth variable capacitance element.

One end (an example of a first end) of the parallel circuit is connected to the other end of the PMOS capacitor M3, and the other end (an example of a second end) of the parallel circuit is connected to the other end of the PMOS capacitor M4. The inductor L1 and the inductor L2 are magnetically coupled (M-coupled) to each other. A fixed voltage VBIAS is applied to a midpoint of the inductor L2, and the fixed voltage VBIAS is applied to the other end of each of the PMOS capacitors M3 and M4 via the second node ND2 and the inductor L2.

As a layout of the inductors L1 and L2, the inductor L2 is disposed on an inner side of the inductor L1, and the inductor L1 and the inductor L2 are M-coupled. By providing the inductor L2 on the inner side of the inductor L1, integration can be performed without increasing an area of the voltage controlled oscillator 10c.

That is, the voltage controlled oscillator 10c is provided with a primary-side LC resonance circuit including the inductor L1 and the variable capacitance elements Cv1 and Cv2, and a secondary-side LC resonance circuit including the inductor L2 and the variable capacitance element Cv.

An oscillation frequency of the voltage controlled oscillator 10c is determined based on inductance values of the inductors L1 and L2, the combined capacitance value of the capacitance value of the variable capacitance element Cv1 and the capacitance value of the variable capacitance element Cv2, the capacitance value of the PMOS capacitor M3, the capacitance value of the PMOS capacitor M4, and a capacitance value of the variable capacitance element Cv.

(Operations and Effects)

Next, operation of the voltage controlled oscillator 10c according to the second embodiment configured in this way will be described. Because operation of the N-type MOS transistors M1 and M2 and the PMOS capacitors M3 and M4 when a bias current from the current source I1 flows to the N-type MOS transistor M1 and the N-type MOS transistor M2 via the inductor L1 are the same as those of the voltage controlled oscillator 10a according to the first embodiment, description thereof will be omitted.

Herein, operations of the secondary-side LC resonance circuit including the inductor L2, which is M-coupled to the inductor L1, and the variable capacitance element Cv will be described.

When the current from the current source I1 flows to the inductor L1, a voltage based on a mutual inductance and a temporal change in the current is generated in the inductor L2 M-coupled to the inductor L1. At this time, when there is a noise in the current of the current source I1, a noise based on the noise and the mutual inductance is generated in the secondary-side LC resonance circuit.

The noise generated in the secondary-side LC resonance circuit operates to eliminate the noise of the current of the current source I1. Herein, the operation is that: by making the inductor L1 and the inductor L2 M-coupled in an opposite phase, an opposite phase of the current source (low frequency band) noise in the primary-side LC resonance circuit is present in the secondary-side LC resonance circuit, and by feeding the opposite phase of the current source noise back to the primary-side LC resonance circuit via the PMOS capacitors M3 and M4, the noise is eliminated. Therefore, according to the voltage controlled oscillator 10c according to the second embodiment, by providing the parallel circuit of the inductor L2 and the variable capacitance element Cv, it is possible to further prevent the fluctuation of the oscillation frequency due to the current fluctuation of the current source I1. Accordingly, a phase noise caused by the noise of the current source I1 can be further reduced as compared to the voltage controlled oscillator 10a according to the first embodiment.

(Modification)

Figure 4:
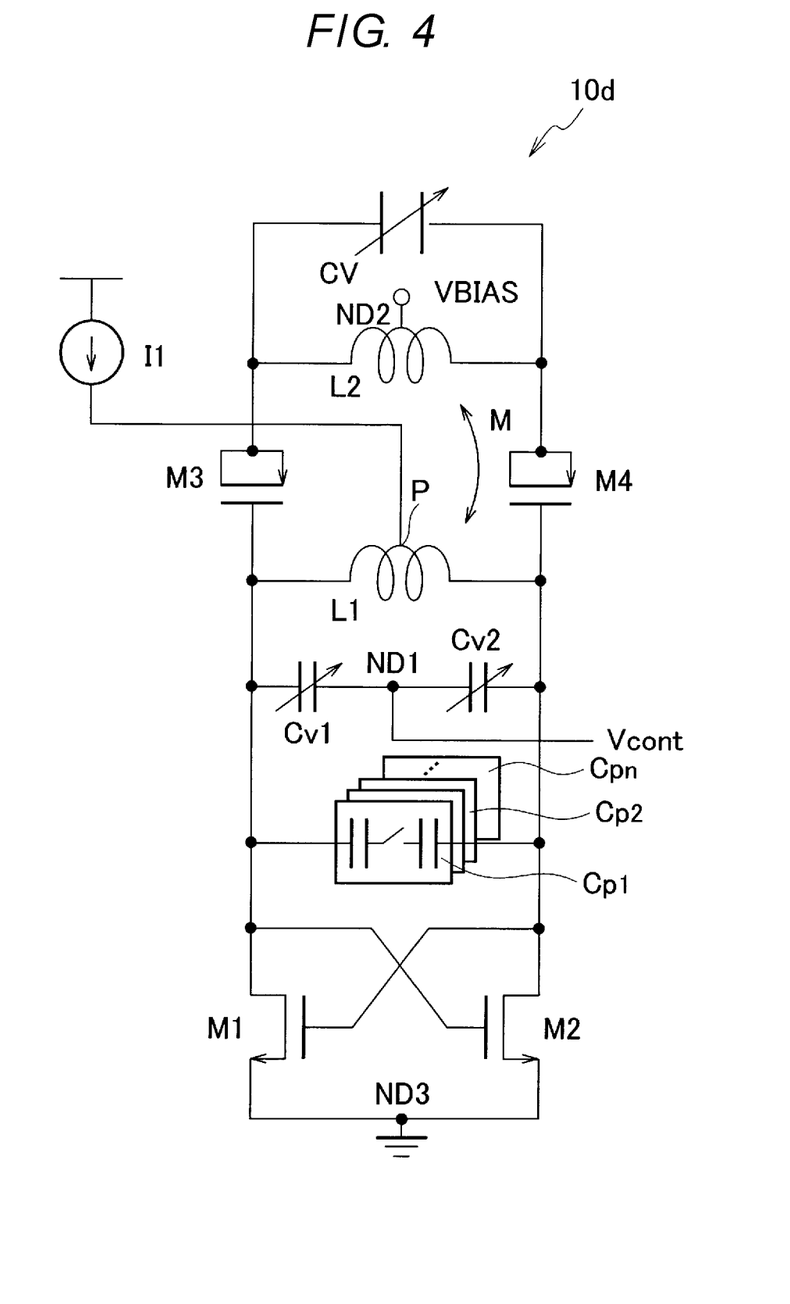
FIG. 4 is a configuration diagram of a voltage controlled oscillator according to a modification of the second embodiment.

FIG. 4 is a configuration diagram of a voltage controlled oscillator 10d according to a modification of the second embodiment. As with the voltage controlled oscillator 10b according to the modification of the first embodiment, the voltage controlled oscillator 10d according to the modification of the second embodiment has a configuration in which a plurality of capacitance elements Cp1, Cp2, . . . , Cpn having fixed capacitance values are further connected between both ends of the inductor L1 in the configuration of the voltage controlled oscillator 10c according to the second embodiment.

An oscillation frequency of the voltage controlled oscillator 10d is basically determined based on the inductance values of the inductors L1 and L2, the combined capacitance value of the capacitance value of the variable capacitance element Cv1 and the capacitance value of the variable capacitance element Cv2, the capacitance value of the PMOS capacitor M3, the capacitance value of the PMOS capacitor M4, and the capacitance value of the variable capacitance element Cv. However, the oscillation frequency may not be set to an appropriate value only with these values. In this case, by connecting the plurality of capacitance elements Cp1, Cp2, . . . , Cpn having the fixed capacitance values between both ends of the inductors L1 and L2, the oscillation frequency can be set to an appropriate value.

(Improvement Effects of Phase Noise in First Embodiment and Second Embodiment)

Figure 5:
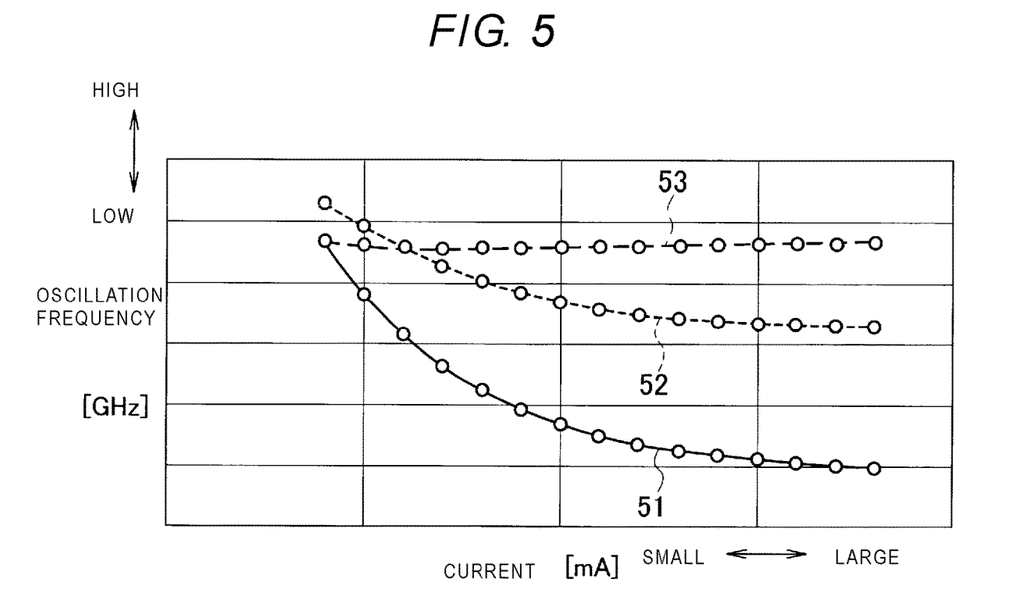
FIG. 5 is a diagram showing characteristics of an oscillation frequency with respect to currents of the voltage controlled oscillators according to a comparative example, the first embodiment, and the second embodiment.

FIG. 5 is a diagram showing characteristics of the oscillation frequency with respect to the currents of the voltage controlled oscillators 10 (10a and 10c) according to the first embodiment and the second embodiment. In FIG. 5, a characteristic 51 indicates a characteristic of a voltage controlled oscillator according to a comparative example, a characteristic 52 indicates a characteristic of the voltage controlled oscillator 10a according to the first embodiment, and a characteristic 53 indicates a characteristic of the voltage controlled oscillator 10c according to the second embodiment. An x-axis indicates the current and a y-axis indicates the oscillation frequency. In the characteristic 51, the frequency fluctuation with respect to the current fluctuation is large, in the characteristic 52, the frequency fluctuation with respect to the current fluctuation is small, and the characteristic 53 is flat with almost no frequency fluctuation with respect to the current fluctuation.

Figure 6:
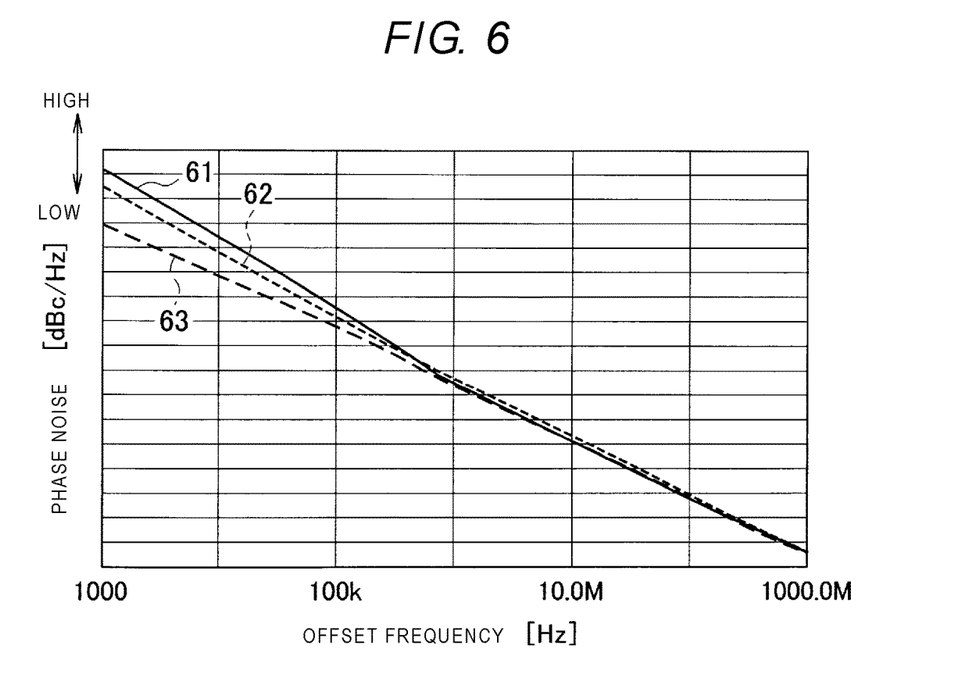
FIG. 6 is a diagram showing characteristics of a phase noise with respect to offset frequencies of the voltage controlled oscillators according to the first embodiment and the second embodiment.

FIG. 6 is a diagram showing characteristics of the phase noise with respect to offset frequencies (difference between the oscillation frequency and a detection frequency) of the voltage controlled oscillators 10 (10a and 10c) according to the first embodiment and the second embodiment. A characteristic 61 indicates a characteristic of the voltage controlled oscillator according to the comparative example, a characteristic 62 indicates a characteristic of the voltage controlled oscillator 10a according to the first embodiment, and a characteristic 63 indicates a characteristic of the voltage controlled oscillator 10c according to the second embodiment. An x-axis indicates the offset frequency and a y-axis indicates the phase noise. For example, a phase noise at an offset frequency of 1 KHz is smaller in the characteristic 62 and is further smaller in the characteristic 63 than that of the characteristic 61. On the other hand, after 100 kHz, there is no significant difference among the characteristics. The unit of the y-axis in FIG. 6 is dBc/Hz.

(Voltage Controlled Oscillator According to Third Embodiment)

Figure 7:
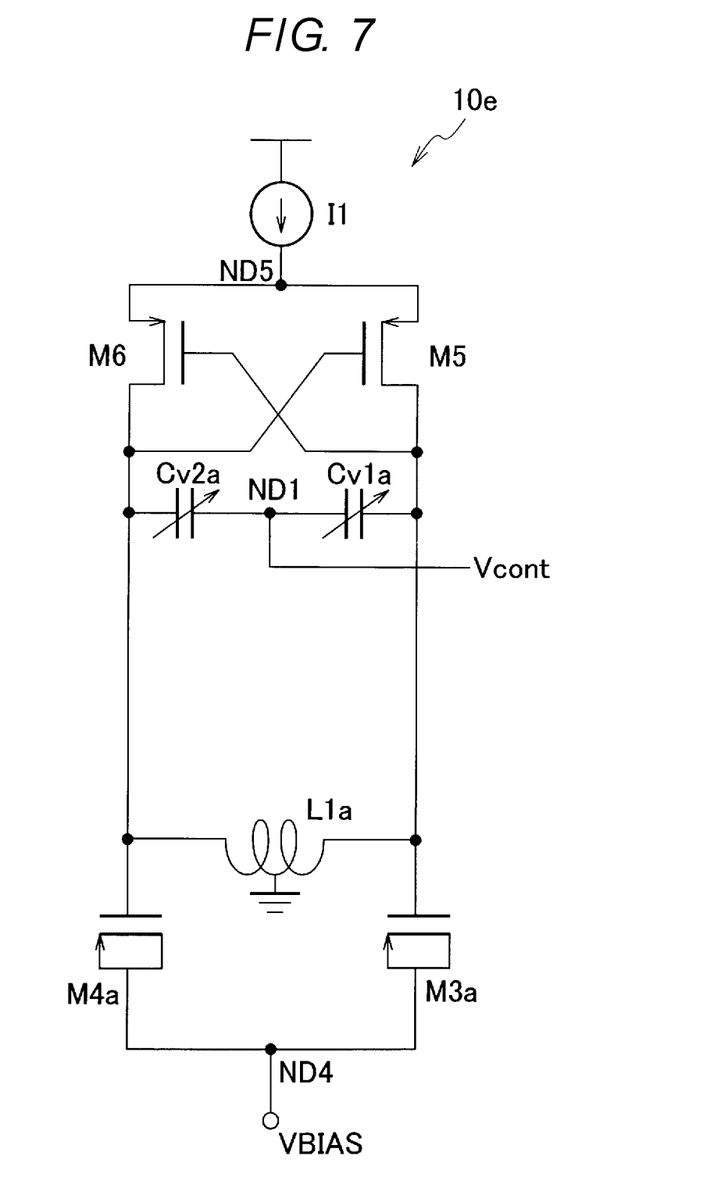
FIG. 7 is a configuration diagram of a voltage controlled oscillator according to a third embodiment.

FIG. 7 is a configuration diagram of a voltage controlled oscillator 10e according to a third embodiment. The voltage controlled oscillator 10e according to the third embodiment has a configuration in which P-type MOS transistors M5 and M6 are provided instead of the N-type MOS transistors M1 and M2 in the voltage controlled oscillator 10a according to the first embodiment shown in FIG. 1.

The current source I1 is connected to sources of the P-type MOS transistors M5 and M6 via a node ND5, and a gate of the P-type MOS transistor M5 is connected to a drain of the P-type MOS transistor M6. A gate of the P-type MOS transistor M6 is connected to a drain of the P-type MOS transistor M5. The P-type MOS transistor M5 and the P-type MOS transistor M6 constitute a cross-coupled unit.

One end (an example of a first end) of a variable capacitance element Cv1a, the drain of the P-type MOS transistor M5, and one end (an example of a first end) of a PMOS capacitor M3a are connected to one end (an example of a first end) of an inductor L1a. One end (an example of a first end) of a variable capacitance element Cv2a, the drain of the P-type MOS transistor M6, and one end (an example of a first end) of a PMOS capacitor M4a are connected to the other one end (an example of a second end) of the inductor L1a.

The other end (an example of a second end) of the variable capacitance element Cv1a and the other end (an example of a second end) of the variable capacitance element Cv2a are commonly connected, and the first variable voltage Vcont is applied to the common connection end via the first node ND1. By varying the first variable voltage Vcont, a capacitance value of the variable capacitance element Cv1a and a capacitance value of the variable capacitance element Cv2a are changed.

The second variable voltage VBIAS is applied to the other ends (examples of second ends) of the PMOS capacitors M3a and M4a via a fourth node ND4 (an example of a second node), and a voltage at one end of each of the PMOS capacitors M3a and M4a changes due to a change in a bias current from the second variable voltage VBIAS. Therefore, the PMOS capacitors M3a and M4a constitute a second variable capacitance unit whose capacitance changes due to a change in the voltage between both ends. The PMOS capacitor M3a corresponds to the third variable capacitance element, and the PMOS capacitor M4a corresponds to the fourth variable capacitance element.

In this way, according to the voltage controlled oscillator 10e according to the third embodiment, the bias current from the current source I1 flows to the P-type MOS transistor M5 and the P-type MOS transistor M6 and flows to the ground via the inductor L1a.

Therefore, a voltage of the drain of the P-type MOS transistor M5 and a voltage of the drain of the P-type MOS transistor M6 rise. At this time, due to the current fluctuation of the current source I1 caused by minute fluctuation of a power supply voltage or a temperature, an amplitude of the current flowing to the P-type MOS transistor M5 fluctuates, and due to the current amplitude fluctuation, a parasitic capacitance C5 between the drain and the source of the P-type MOS transistor M5 changes. For example, the parasitic capacitance C5 increases by a change capacitance ΔC5.

Similarly, an amplitude of the current flowing to the P-type MOS transistor M6 fluctuates, and due to the current amplitude fluctuation, a parasitic capacitance C6 between the drain and the source of the P-type MOS transistor M6 changes. For example, the parasitic capacitance C6 increases by a change capacitance ΔC6. Due to a capacitance change caused by the change capacitance ΔC5 and the change capacitance ΔC6, the oscillation frequency fluctuates and the phase noise in a low frequency band is deteriorated.

On the other hand, the voltage of the drain of the P-type MOS transistor M5 is applied to one end of the PMOS capacitor M3a, and the voltage of the drain of the P-type MOS transistor M6 is applied to one end of the PMOS capacitor M4a. Further, the second variable voltage VBIAS is applied to the other end of the PMOS capacitor M3a and the other end of the PMOS capacitor M4a.

At this time, since the voltage between the both ends of the PMOS capacitor M3a is reduced, a depletion layer thereof decreases. Therefore, a capacitance C3a between the both ends of the PMOS capacitor M3a changes and decreases by a change capacitance ΔC3a. Further, since the voltage between the both ends of the PMOS capacitor M4a is reduced, a depletion layer thereof decreases. Therefore, a capacitance C4a between the both ends of the PMOS capacitor M4a changes and decreases by a change capacitance ΔC4a.

At this time, the change capacitance ΔC3a and the change capacitance ΔC4a can be adjusted by adjusting the second variable voltage VBIAS by external control. For example, by decreasing the value of the second variable voltage VBIAS, the change capacitance ΔC3a and the change capacitance ΔC4a can be increased to offset the increase in the change capacitance ΔC5 and the change capacitance ΔC6 and the capacitance change can be eliminated. That is, by correcting the parasitic capacitances of the P-type MOS transistors M5 and M6, which change due to the current fluctuation, with the capacitance of the PMOS capacitors M3a and M4a, a change in a parasitic capacitance component of a tank circuit including the inductor L1a can be reduced.

That is, by adding the PMOS capacitors M3a and M4a for correcting the change in the parasitic capacitance of the P-type MOS transistors M5 and M6, a capacitance change does not occur even if the current from the current source changes. Therefore, the fluctuation of the oscillation frequency caused by the current fluctuation of the current source I1 can be eliminated. Accordingly, the phase noise can be reduced. For example, the area (size) of the current source I1 can be reduced.

(Modification)

Further, as a modification, as in the modifications the first and the second embodiments as shown in FIGS. 2 and 4, fixed capacitance elements Cp1, Cp2, . . . , Cpn may be further connected between the both ends of the inductor L1a in the configuration shown in FIG. 7. With the configuration, the oscillation frequency of the voltage controlled oscillator 10e according to the third embodiment can be set to an appropriate value.

(Voltage Controlled Oscillator According to Fourth Embodiment)

Figure 8:
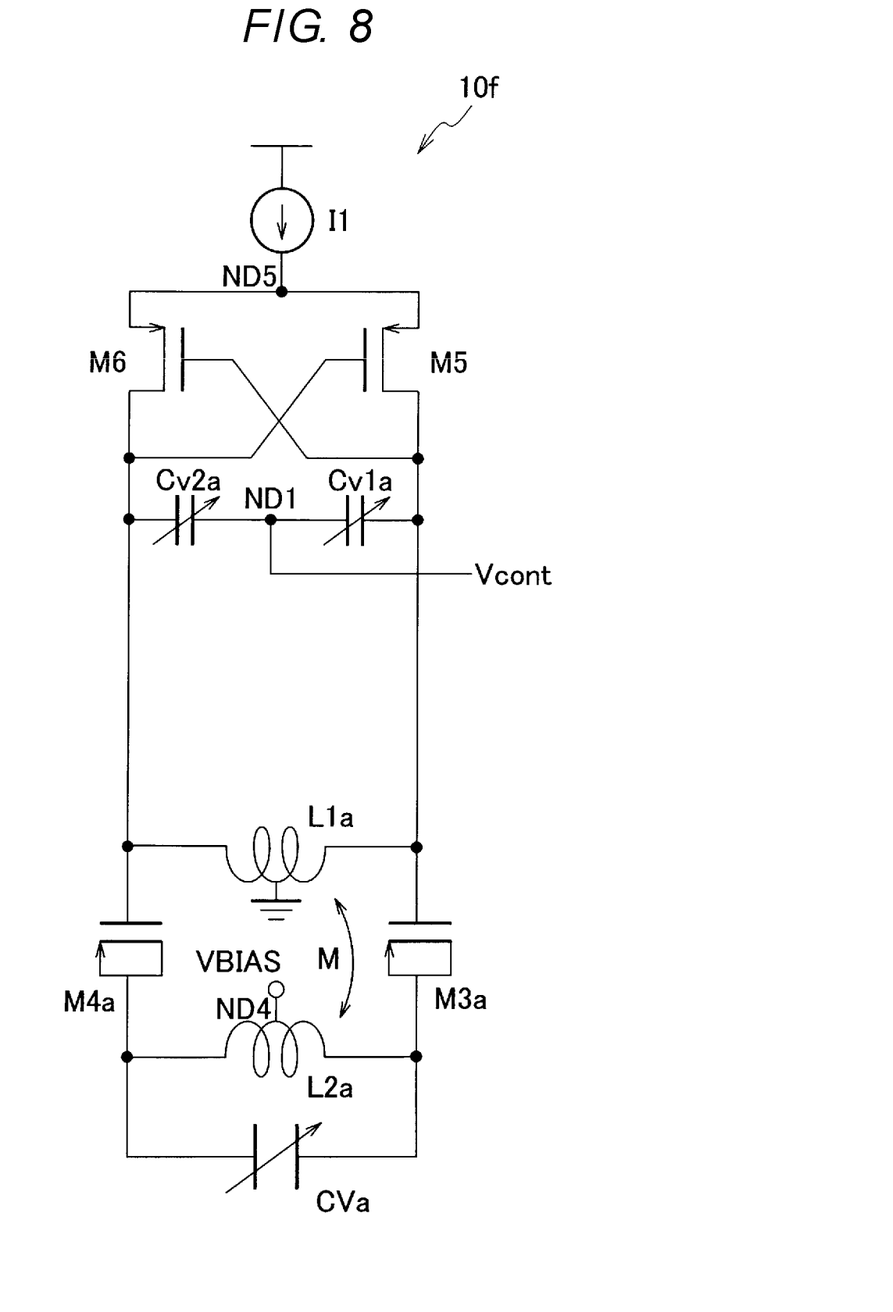
FIG. 8 is a configuration diagram of a voltage controlled oscillator according to a fourth embodiment.

FIG. 8 is a configuration diagram of a voltage controlled oscillator 10f according to a fourth embodiment. With respect to the voltage controlled oscillator 10e according to the third embodiment shown in FIG. 7, the voltage controlled oscillator 10f according to the fourth embodiment is further provided with a resonance circuit including a parallel circuit of an inductor L2a and a variable capacitance element Cva.

One end (an example of a first end) of the parallel circuit is connected to the other end of the PMOS capacitor M3a, and the other end (an example of a second end) of the parallel circuit is connected to the other end of the PMOS capacitor M4a. The inductor L1a and the inductor L2a are M-coupled. The fixed voltage VBIAS is applied to a midpoint of the inductor L2a, and the fixed voltage VBIAS is applied to the other ends of the PMOS capacitors M3a and M4a via the inductor L2a.

As a layout of the inductor, the inductor L2a is disposed inside the inductor L1a, and the inductor L1a and the inductor L2a are M-coupled. By disposing the inductor L2a in the inner side of the inductor L1a, an area of the circuit does not need to increase.

That is, the voltage controlled oscillator 10f is provided with a primary-side LC resonance circuit including the inductor L1a and the variable capacitance elements Cv1a and Cv2a, and a secondary-side LC resonance circuit including the inductor L2a and the variable capacitance element Cva.

An oscillation frequency of the voltage controlled oscillator 10f is determined based on inductance values of the inductors L1a and L2a, a combined capacitance value of a capacitance value of the variable capacitance element Cv1a and a capacitance value of the variable capacitance element Cv2a, a capacitance value of the PMOS capacitor M3a, a capacitance value of the PMOS capacitor M4a, and a capacitance value of the variable capacitance element Cva.

According to the voltage controlled oscillator 10f according to the fourth embodiment configured in this way, similar operations as those of the voltage controlled oscillator 10c according to the second embodiment are performed, and similar effects are obtained.

(Modification)

Figure 9:
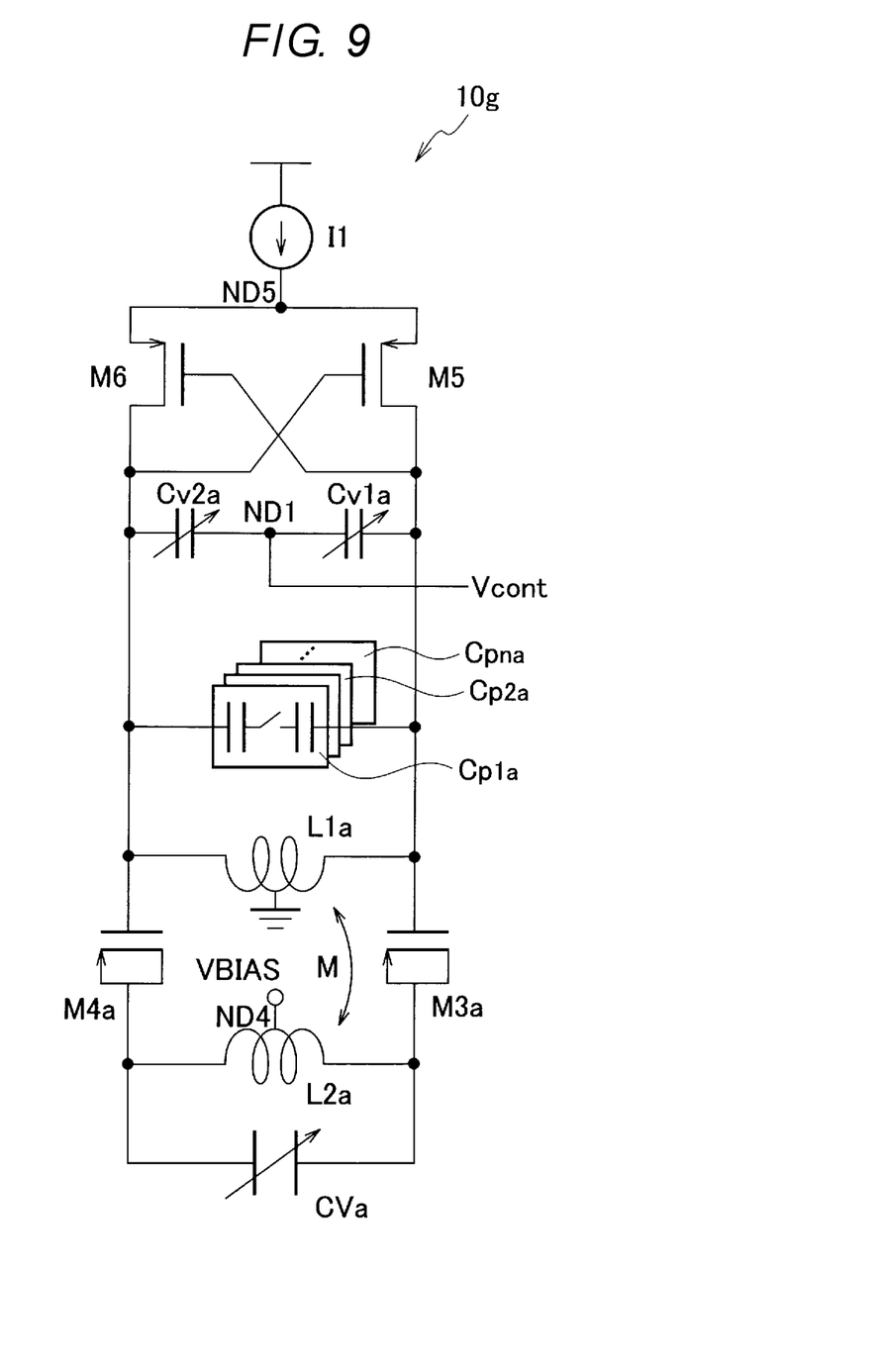
FIG. 9 is a configuration diagram of a voltage controlled oscillator according to a modification of the fourth embodiment.

FIG. 9 is a configuration diagram of a voltage controlled oscillator 10g according to a modification of the fourth embodiment. As the voltage controlled oscillator 10b according to the modification of the first embodiment, the voltage controlled oscillator 10g according to the modification of the fourth embodiment has a configuration in which a plurality of capacitance elements Cp1a, Cp2a, . . . , Cpna having fixed capacitance values are further connected between both ends of the inductor L1 in the configuration of the voltage controlled oscillator 10f according to the fourth embodiment.

An oscillation frequency of the voltage controlled oscillator 10g is basically determined based on the inductance values of the inductors L1a and L2a, the combined capacitance value of the capacitance value of the variable capacitance element Cv1a and the capacitance value of the variable capacitance element Cv2a, the capacitance value of the PMOS capacitor M3a, the capacitance value of the PMOS capacitor M4a, and the capacitance value of the variable capacitance element Cva. However, the oscillation frequency may not be set to an appropriate value only with these values. In this case, by connecting fixed capacitance elements Cp1a, Cp2a, . . . , Cpna between both ends of the inductor L1a, the oscillation frequency can be set to an appropriate value.

(Improvement Effects of Phase Noise in Fourth Embodiment)

Figure 10:
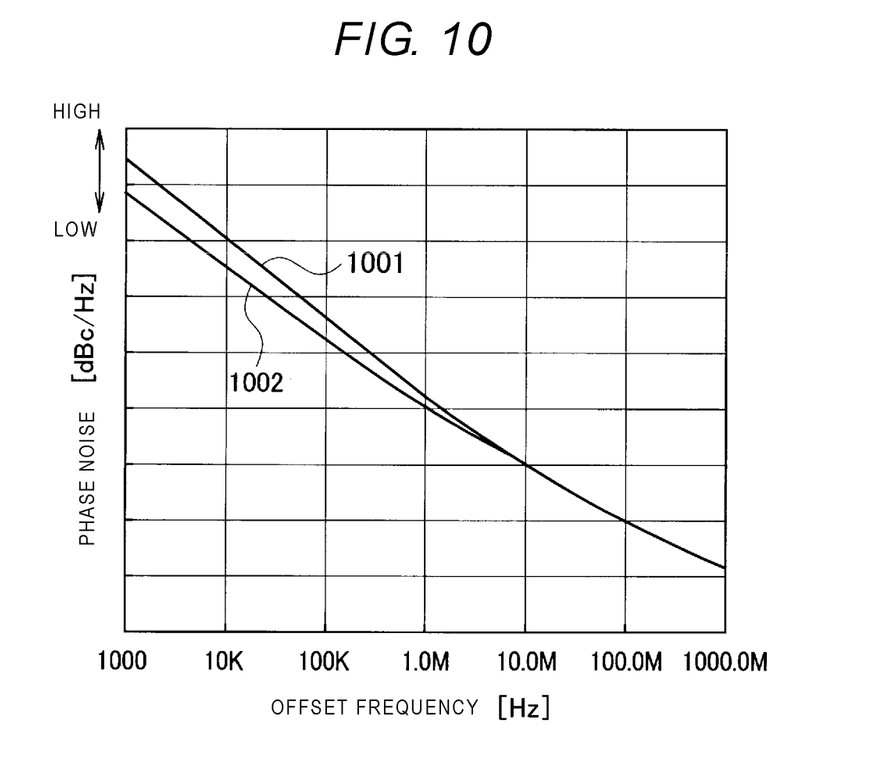
FIG. 10 is a diagram showing characteristics of a phase noise with respect to an offset frequency of the voltage controlled oscillator according to the fourth embodiment.

FIG. 10 is a diagram showing characteristics of the phase noise with respect to the offset frequency of the voltage controlled oscillator 10g according to the fourth embodiment. A characteristic 1001 indicates a characteristic of a voltage controlled oscillator according to a comparative example, and a characteristic 1002 indicates a characteristic of the voltage controlled oscillator 10g according to the fourth embodiment. An x-axis indicates the offset frequency and a y-axis indicates the phase noise. As shown in FIG. 10, for example, a phase noise at an offset frequency of 1 KHz is smaller in the characteristic 1002 than that in the characteristic 1001 (comparative example).

(Semiconductor Integrated Circuit According to Fifth Embodiment)

Figure 11:
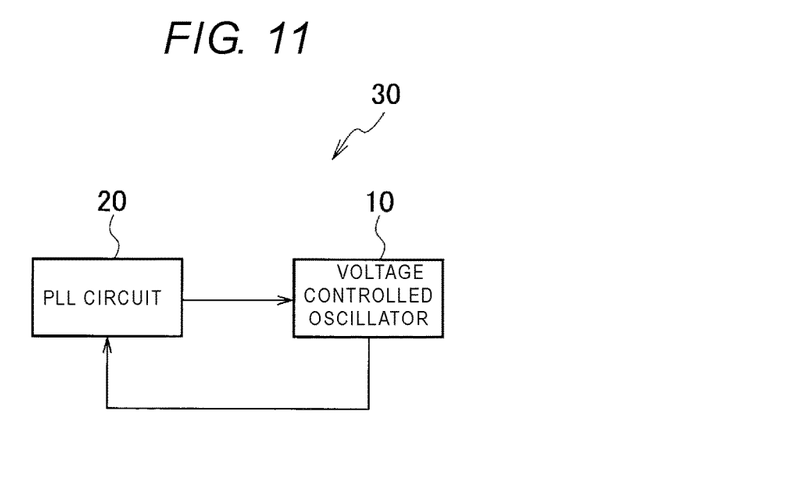
FIG. 11 is a diagram showing a semiconductor integrated circuit according to a fifth embodiment including the voltage controlled oscillator according to any one of the first to fourth embodiments.

FIG. 11 is a diagram showing a semiconductor integrated circuit 30 according to a fifth embodiment including the voltage controlled oscillator 10 according to the first to fourth embodiments. The voltage controlled oscillators 10 according to the first to fourth embodiments and the modifications can be applied to the semiconductor integrated circuit 30.

The semiconductor integrated circuit 30 includes the voltage controlled oscillator 10 according to any one of the first to the fourth embodiments and a phase locked loop circuit, that is, a PLL circuit 20. The voltage controlled oscillator 10 outputs, to the PLL circuit 20, a first clock signal whose oscillation frequency changes according to a voltage change in an input voltage from the PLL circuit 20.

The PLL circuit 20 converts an error signal generated based on the first clock signal from the voltage controlled oscillator 10 and a second clock signal serving as a reference through a loop filter into a control signal. The PLL circuit outputs the control signal to the voltage controlled oscillator 10 and controls an oscillation frequency of the first clock signal to be constant based on the control signal supplied from the voltage controlled oscillator 10.

(Effects)

In this way, according to the semiconductor integrated circuit according to the fifth embodiment, by connecting the PLL circuit to the input and output of the voltage controlled oscillator, the oscillation frequency of the voltage controlled oscillator can be controlled to be constant, and a stable oscillation frequency with reduced phase noise can be obtained.

(Transmission and Reception Device According to Sixth Embodiment)

Figure 12:
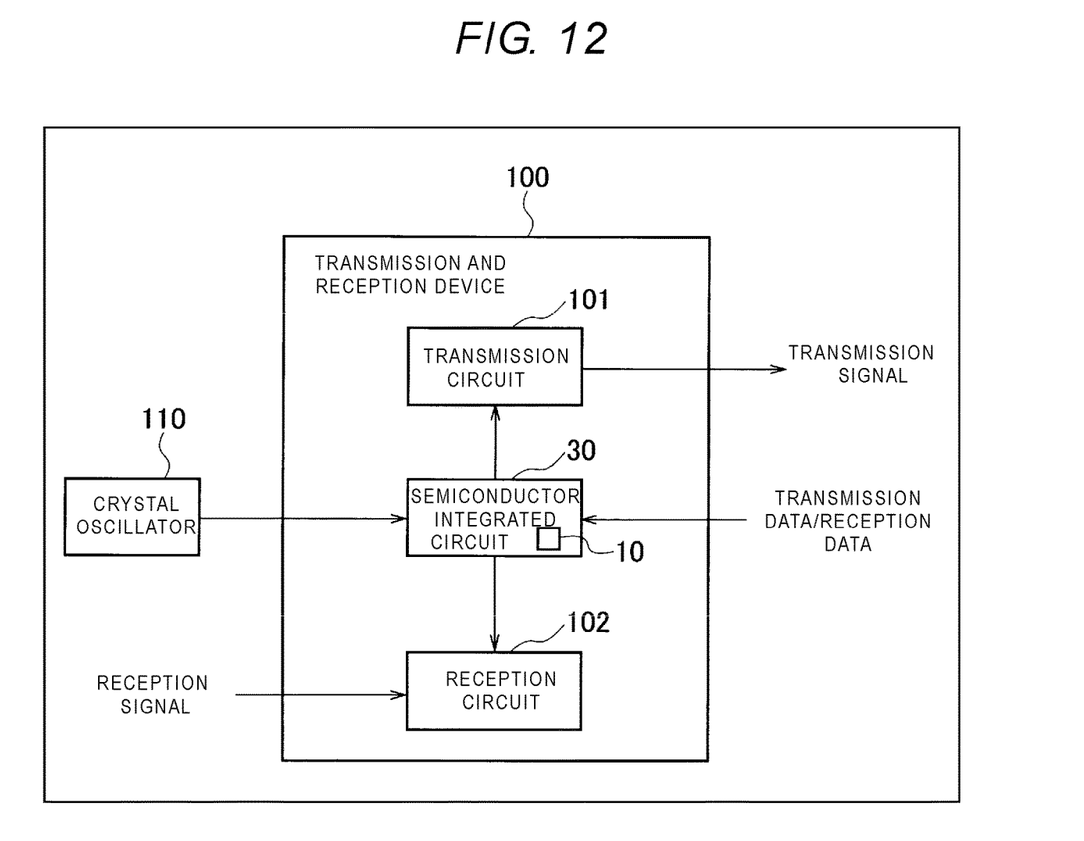
FIG. 12 is a configuration block diagram of a transmission and reception device according to a sixth embodiment including the semiconductor integrated circuit including the voltage controlled oscillator according to any one of the first to the fourth embodiments.

FIG. 12 is a configuration block diagram of a transmission and reception device 100 according to a sixth embodiment including the semiconductor integrated circuit 30 including the voltage controlled oscillator 10 according to any one of the first to the fourth embodiments. The transmission and reception device 100 according to the sixth embodiment can be applied to a transmission and reception device in a wireless communication system or a wired communication system.

The transmission and reception device 100 includes the semiconductor integrated circuit 30 according to the fifth embodiment, a transmission circuit 101, and a reception circuit 102. A crystal oscillator 110 outputs a reference clock to the semiconductor integrated circuit 30. The crystal oscillator 110 may be provided in the transmission and reception device 100.

The semiconductor integrated circuit 30 inputs transmission data, and outputs to the transmission circuit 101 the input transmission data and the first clock signal from the voltage controlled oscillator 10. The transmission circuit 101 modulates the input transmission data with the first clock signal (carrier signal) and outputs the modulated transmission data as a transmission signal.

The semiconductor integrated circuit 30 inputs reception data, and outputs to the reception circuit 102 the input reception data and the first clock signal from the voltage controlled oscillator 10. The reception circuit 102 demodulates the input reception data with the first clock signal, and outputs the demodulated reception circuit as a reception signal.

(Effects)

In this way, according to the transmission and reception device according to the sixth embodiment, the transmission data is modulated or the reception data is demodulated with the first clock signal whose phase noise is reduced by the voltage controlled oscillator 10 according to any one of the first to the fourth embodiments. Therefore, the modulated transmission data or the demodulated reception data becomes data whose phase noise is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage controlled oscillator comprising:
a first inductor;
a first variable capacitance circuit connected in parallel with the first inductor, the first variable capacitance circuit including a first variable capacitance element having a variable capacitance and a second variable capacitance element having a variable capacitance;
a first node configured for application of a first voltage to the first variable capacitance circuit;
a cross-coupled circuit connected to the first inductor, the cross-coupled circuit including a first transistor and a second transistor, wherein an output of the first transistor is connected to an input of the second transistor;
a current source configured to flow a current through the first inductor, the first transistor, and the second transistor;
a second variable capacitance circuit including a third variable capacitance element that is connected to the first transistor and having a variable capacitance, and a fourth variable capacitance element that is connected to the second transistor and having a variable capacitance; and
a second node different from the first node and configured for application of a second voltage to the second variable capacitance circuit.

2. The voltage controlled oscillator according to claim 1, wherein
a first end of the first variable capacitance element is connected to a first end of the first inductor, a first end of the second variable capacitance element is connected to a second end of the first inductor, and the first voltage is applied via the first node to a second end of the first variable capacitance element and to a second end of the second variable capacitance element,
the first transistor includes a first terminal, a second terminal, and a first control terminal, the second transistor includes a third terminal, a fourth terminal, and a second control terminal, the first terminal is connected to the first end of the first inductor and the second control terminal, the third terminal is connected to the second end of the first inductor and the first control terminal, and the second terminal and the fourth terminal are connected to a node serving as a reference voltage, and
a first end of the third variable capacitance element is connected to the first terminal, a first end of the fourth variable capacitance element is connected to the third terminal, and the second voltage is applied via the second node to a second end of the third variable capacitance element and to a second end of the fourth variable capacitance element.

3. The voltage controlled oscillator according to claim 1, further comprising:
a resonance circuit including a second inductor connected between the third variable capacitance element and the fourth variable capacitance element; and
a fifth variable capacitance element connected in parallel with the second inductor, wherein
the second inductor is magnetically coupled to the first inductor, and a second voltage is applied to a midpoint of the second inductor via the second node.

4. The voltage controlled oscillator according to claim 3, wherein the first inductor and the first and second variable capacitance elements are disposed on a primary-side of the resonance circuit, and the second inductor and the fifth variable capacitance element are disposed on a secondary-side of the resonance circuit.

5. The voltage controlled oscillator according to claim 4, wherein in response to a current including a noise flowing from the current source to the first transistor and the second transistor, an opposite phase of the noise, induced on the secondary-side, is provided to the primary-side via the third and fourth variable capacitance elements.

6. The voltage controlled oscillator according to claim 1, wherein the first transistor and the second transistor each include an N-type metal-oxide-semiconductor (MOS) transistor.

7. The voltage controlled oscillator according to claim 1, wherein the first transistor and the second transistor each include a P-type metal-oxide-semiconductor (MOS) transistor.

8. The voltage controlled oscillator according to claim 1, wherein
in response to a current including a noise flowing from the current source to the first transistor and the second transistor, based on the second voltage applied via the second node, the capacitance of the third variable capacitance element is changed to offset a change capacitance of the first transistor, and the capacitance of the fourth variable capacitance element is changed to offset a change capacitance of the second transistor.

9. The voltage controlled oscillator according to claim 1, wherein a phase locked loop circuit is coupled to the voltage controlled oscillator, and wherein the phase locked loop circuit is configured to convert an error signal generated based on a first clock signal supplied from the voltage controlled oscillator and a second clock serving as a reference into a control signal, to output the control signal to the voltage controlled oscillator, and to control an oscillation frequency of the first clock signal to be constant based on the control signal supplied from the voltage controlled oscillator.

10. The voltage controlled oscillator according to claim 1, further comprising a plurality of capacitance elements, each of which has a fixed capacitance value, connected between both ends of the first inductor.

11. A semiconductor integrated circuit, comprising:
a voltage controlled oscillator comprising:
 a first inductor;
 a first variable capacitance circuit connected in parallel with the first inductor, the first variable capacitance circuit including a first variable capacitance element having a variable capacitance and a second variable capacitance element having a variable capacitance, a first node configured for application of a first voltage to the first variable capacitance circuit;
 a cross-coupled circuit connected to the first inductor, the cross-coupled circuit including a first transistor and a second transistor, wherein an output of the first transistor is connected to an input of the second transistor;
 a current source configured to flow a current through the first inductor, the first transistor, and the second transistor;
 a second variable capacitance circuit including a third variable capacitance element that is connected to the first transistor and having a variable capacitance, and a fourth variable capacitance element that is connected to the second transistor and having a variable capacitance; and a second node different from the first node and configured for application of a second voltage to the second variable capacitance circuit; and
a phase locked loop circuit configured to convert an error signal generated based on a first clock signal supplied from the voltage controlled oscillator and a second clock serving as a reference into a control signal, to output the control signal to the voltage controlled oscillator, and to control an oscillation frequency of the first clock signal to be constant based on the control signal supplied from the voltage controlled oscillator.

12. A transmission and reception device comprising:
the semiconductor integrated circuit according to claim 11;
a transmission circuit configured to modulate input transmission data using the first clock signal from the voltage controlled oscillator provided in the semiconductor integrated circuit, and to output the modulated transmission data as a transmission signal; and
a reception circuit configured to demodulate input reception data using the first clock signal, and to output the demodulated reception circuit as a reception signal.

13. The transmission and reception device according to claim 12, wherein
a first end of the first variable capacitance element is connected to a first end of the first inductor, a first end of the second variable capacitance element is connected to a second end of the first inductor, and the first voltage is applied via the first node to a second end of the first variable capacitance element and to a second end of the second variable capacitance element,
the first transistor includes a first terminal, a second terminal, and a first control terminal, the second transistor includes a third terminal, a fourth terminal, and a second control terminal, the first terminal is connected to the first end of the first inductor and the second control terminal, the third terminal is connected to the second end of the first inductor and the first control terminal, and the second terminal and the fourth terminal are connected to a node serving as a reference voltage, and
a first end of the third variable capacitance element is connected to the first terminal, a first end of the fourth variable capacitance element is connected to the third terminal, and the second voltage is applied via the second node to a second end of the third variable capacitance element and to a second end of the fourth variable capacitance element.

14. The transmission and reception device according to claim 12, wherein the voltage controlled oscillator further comprising:
a resonance circuit including a second inductor connected between the third variable capacitance element and the fourth variable capacitance element; and
a fifth variable capacitance element connected in parallel with the second inductor, wherein
the second inductor is magnetically coupled to the first inductor, and a second voltage is applied to a midpoint of the second inductor via the second node.

15. The transmission and reception device according to claim 12, wherein the first transistor and the second transistor each include an N-type metal-oxide-semiconductor (MOS) transistor.

16. The transmission and reception device according to claim 11, wherein the first transistor and the second transistor each include a P-type metal-oxide-semiconductor (MOS) transistor.

17. The transmission and reception device according to claim 12, wherein
in response to a current including a noise flowing from the current source to the first transistor and the second transistor, based on the second voltage applied via the second node, the capacitance of the third variable capacitance element is changed to offset a change capacitance of the first transistor, and the capacitance of the fourth variable capacitance element is changed to offset a change capacitance of the second transistor.

18. The transmission and reception device according to claim 12, wherein the voltage controlled oscillator further comprising a plurality of capacitance elements, each of which has a fixed capacitance value, connected between both ends of the first inductor.

* * * * *